United States Patent [19]

Prall

[11] Patent Number: 6,010,953
[45] Date of Patent: *Jan. 4, 2000

[54] METHOD FOR FORMING A SEMICONDUCTOR BURIED CONTACT WITH A REMOVABLE SPACER

[75] Inventor: Kirk D. Prall, Boise, Id.

[73] Assignee: Micron Technology, Inc., Boise, Id.

[*] Notice: This patent is subject to a terminal disclaimer.

[21] Appl. No.: 08/886,707

[22] Filed: Jul. 1, 1997

Related U.S. Application Data

[63] Continuation-in-part of application No. 08/733,506, Oct. 18, 1996, Pat. No. 5,728,596, which is a continuation of application No. 08/285,335, Aug. 2, 1994, Pat. No. 5,605,864.

[51] Int. Cl.$^7$ .................... H01L 21/3205; H01L 21/4763
[52] U.S. Cl. .................... 438/586; 438/701; 438/396; 438/947; 438/672; 148/DIG. 20
[58] Field of Search .................... 438/586, 701, 438/396, 672, 947; 148/DIG. 20

[56] References Cited

U.S. PATENT DOCUMENTS

| | | |
|---|---|---|
| 5,051,380 | 9/1991 | Maeda et al. |
| 5,223,448 | 6/1993 | Su . |
| 5,422,315 | 6/1995 | Kobayashi . |
| 5,605,864 | 2/1997 | Prall ........................ 438/586 |
| 5,728,596 | 3/1998 | Prall ........................ 438/701 |

FOREIGN PATENT DOCUMENTS

| | | |
|---|---|---|
| 60-22340 | 4/1985 | Japan . |
| 3-248429 | 6/1991 | Japan . |

*Primary Examiner*—John F. Niebling
*Assistant Examiner*—John Murphy
*Attorney, Agent, or Firm*—Trask, Britt & Rossa

[57] ABSTRACT

A removable oxide spacer is used to reduce the size of a contact opening in a memory cell between polysilicon word lines below a lithographic minimum. The removable spacer is deposited before the buried contact patterning and etching. Since word lines diverge at a cell location, the removable spacer retains a lesser thickness over the divergent area contact opening and a greater thickness elsewhere between word lines due to the more narrow gap therebetween and the spacer being deposited such that it fills the gap. The removable spacer reduces the buried contact size since the actual self-aligned contact area is defined by the spacer sidewall. The removable spacer is formed of materials having higher etching selectivity relative to materials forming underlying structures. Etching of the spacer creates a buried contact opening smaller than a lithographic minimum because silicon oxide surrounding the buried contact area is protected by the removable spacer. The removable spacer is removed after the resist strip, leaving a sublithographic buried contact opening.

21 Claims, 6 Drawing Sheets

METHOD FOR FORMING A SEMICONDUCTOR BURIED CONTACT WITH A REMOVABLE SPACER

This application is a continuation-in-part of application Ser. No. 08/733,506, filed Oct. 18, 1996, now U.S. Pat. No. 5,728,596, which is a continuation of application Ser. No. 08/285,335, filed Aug. 2, 1994, now U.S. Pat. No. 5,605,864.

TECHNICAL FIELD

This invention relates, in general, to a method of forming a buried contact in a semiconductor wafer substrate. More particularly, a sublithographic contact is formed using a removable spacer which has improved etching selectivity in relation to an underlying insulator oxide layer in a semiconductor wafer.

BACKGROUND OF THE INVENTION

In semiconductor structures wherein a capacitor is used as a storage element, such as seen in Dynamic Random Access Memory (DRAM) devices, it is necessary to connect the access transistor active area to the capacitor bottom plate (storage plate). This connection is known as a buried contact, i.e., other layers or elements are above the contact surface. Typically, buried contacts are no smaller than the lithographic minimum associated with patterning the wafer.

In order to reduce the cost and increase the speed of operation, memory devices have become increasingly more miniaturized. To that end, each individual component of the semiconductor structure must occupy less space on the device. However, because the capacitance of a capacitor is proportional to the area of the electrodes, to operate efficiently, the overall size of the capacitor must be maintained or a new type of improved capacitor must be employed. Notwithstanding the fact that various new types of capacitors have been recently introduced (e.g., trench and stacked capacitors) limitations in the possible level of capacitor miniaturization necessitates modifying other surrounding structures, such as contact surfaces and buried contact areas, in order to decrease the overall size of the semiconductor device.

With the aforementioned shortcomings in mind, it would be advantageous to provide a method of reducing the size of a semiconductor device (or substructures therein) by forming a sublithographic buried contact which: reduces the cell area; improves the capacitor storage plate registration alignment; provides a smaller buried contact area that intercepts alpha particles such that soft error rate is improved; improves the subthreshold voltage characteristics by moving the buried contact edge away from the access transistor; and facilitates formation of a contact that is self-aligned in both directions so that a single, large, rectangular mask can be used to etch a plurality of buried contacts.

SUMMARY OF THE INVENTION

According to principles of the present invention, a removable spacer, such as ozone tetraethyl orthosilicate ($O_3$TEOS), is used to reduce the size of a contact opening between polysilicon word lines below a lithographic minimum. The removable spacer is deposited before the patterning and forming of a buried contact and is selected from a material having higher etching selectivity than the materials forming the underlying structures and layers, such as the underlying insulator oxide layer.

Since word lines diverge at the location of a DRAM cell where a buried contact exists, the removable spacer is deposited so that it does not completely fill the gap created by the divergence of the word lines, but does fill more narrow gaps at other locations between the word lines. In essence, the divergent area comprises a lesser amount of spacer $O_3$TEOS than other, more narrow gap areas between the word lines. Accordingly, during a removal step (e.g., by etching), the etchant penetrates the lesser amount of $O_3$TEOS at the buried contact area to create the sublithographic buried contact, but does not penetrate other areas where a thicker layer of $O_3$TEOS has filled in the narrow gaps between word lines.

The removable spacer reduces the buried contact size since the actual self-aligned contact area is defined by the spacer sidewall. An opening smaller than a lithographic minimum is etched because silicon oxide surrounding the buried contact area is protected by the removable spacer. The removable spacer is removed after the resist strip, leaving a small buried contact opening.

More specifically, the invention describes a method for forming a removable spacer having an improved etching selectivity in relation to an underlying insulator oxide of a semiconductor wafer. Other objects, advantages, and capabilities of the present invention will become more apparent from the following detailed description with reference to the accompanying drawings.

The invention also describes semiconductor assemblies formed according to the aforementioned methods.

DETAILED DESCRIPTION OF THE INVENTION

Figure 1C:
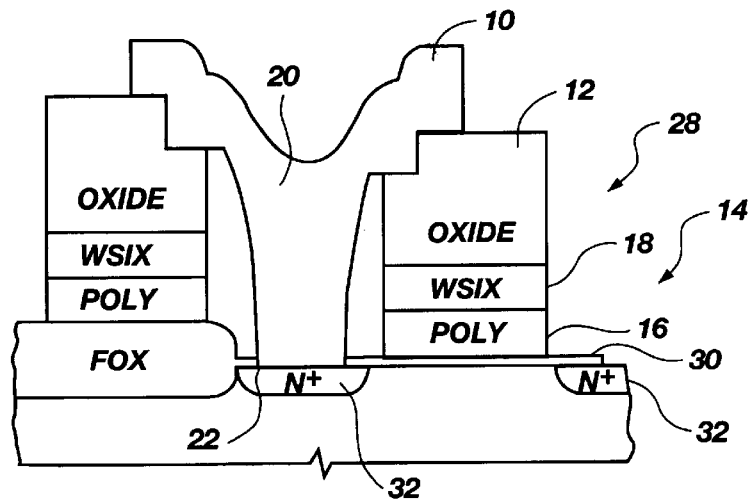
FIG. 1C is a section elevation taken along lines 1C—1C of FIG. 1A (prior art).
Figure 1B:
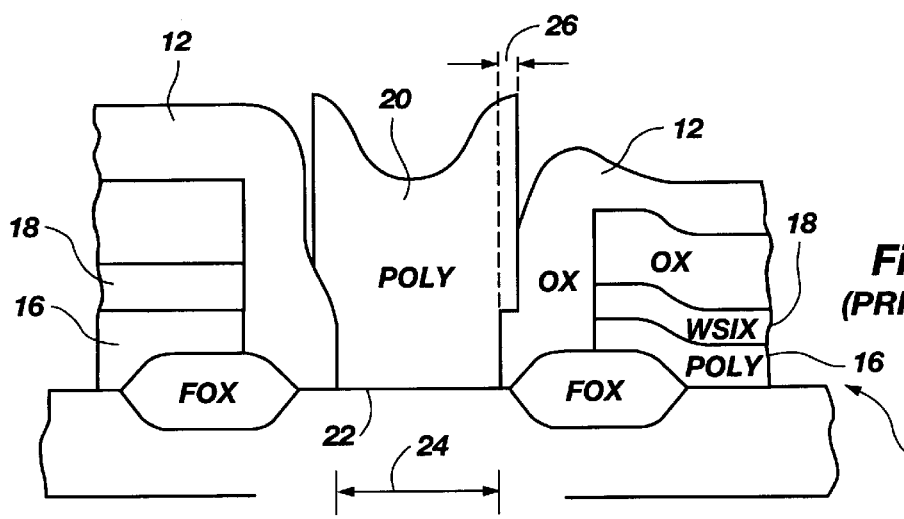
FIG. 1B is a section elevation taken along lines 1B—1B of FIG. 1A (prior art).
Figure 1A:
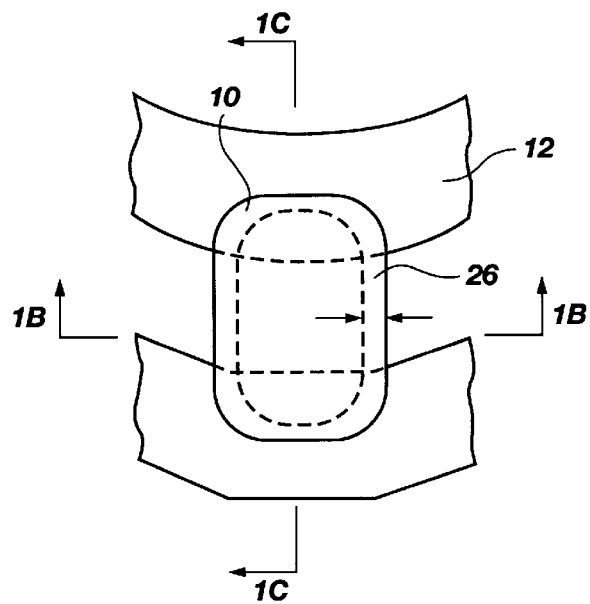
FIG. 1A is a plan view of a prior art memory cell.

FIGS. 1A–C depict a buried contact 22 in the prior art. This prior art is shown in order to more fully recognize the value and novelty of the present invention wherein a sublithographic buried contact is formed. A polysilicon capacitor plate 10 covers an oxide layer 12 and a word line 14. The word line 14 comprises polysilicon 16 and tungsten silicide 18.

In section view FIG. 1B, the polysilicon bottom plate 20 forms the relatively large buried contact at 22 having a width 24 substantially equal to the photolithographic minimum. The overlap, dimension 26, sometimes called the registration budget, is kept minimal because it directly contributes to cell size.

A DRAM transistor 28 can be seen in cross-section in FIG. 1C with the polysilicon and tungsten silicide above a gate oxide layer 30. Active areas 32 are adjacent the gate. The buried contact 22 is the surface below the patterned capacitor storage or bottom plate 20.

Figure 2C:
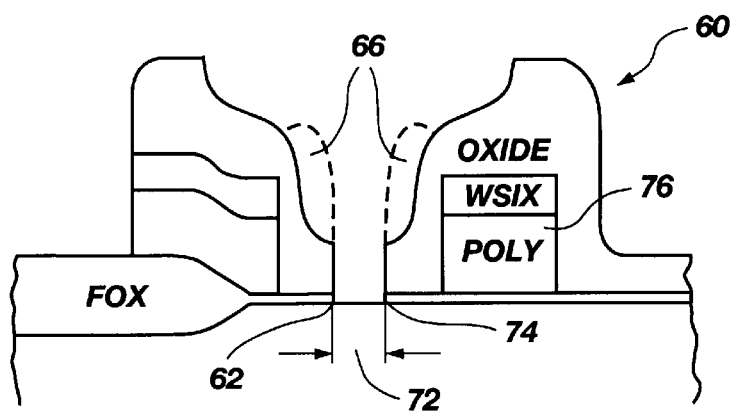
FIG. 2C is a section view taken along lines 2C—2C of FIG. 2A.
Figure 2B:
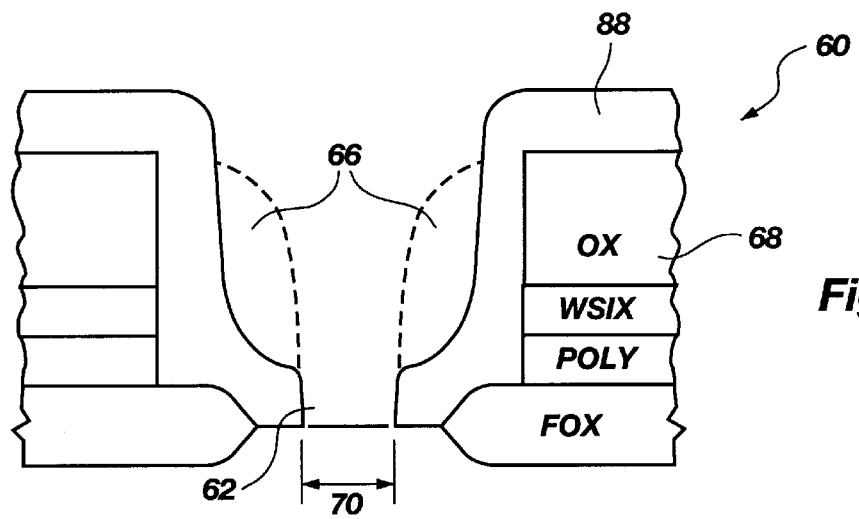
FIG. 2B is a section view taken along lines 2B—2B of FIG. 2A.
Figure 2A:
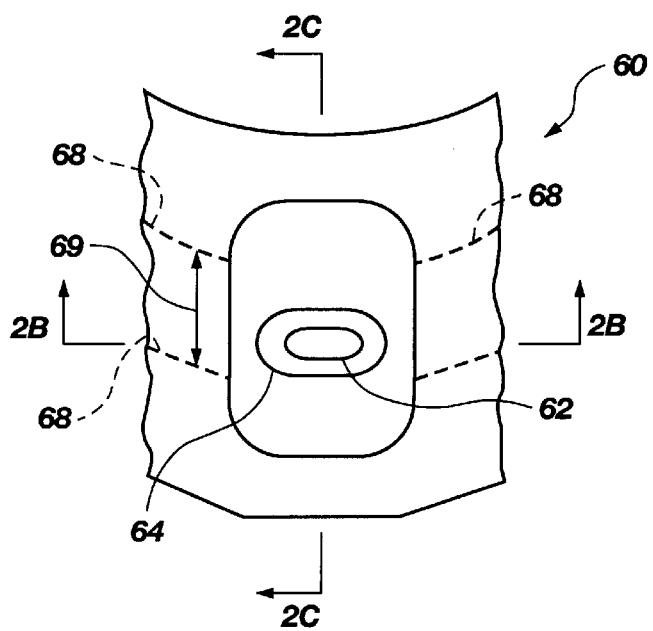
FIG. 2A is a plan view of a buried contact of the present invention.

Referring now to FIGS. 2A–C, a sublithographic buried contact is shown as formed according to principles of the present invention. FIG. 2A is a plan view of a single memory cell 60. An inner oval is the sublithographic contact area 62 formed by using a removable spacer according to principles of the present invention. A larger oval 64 represents the area surrounding the contact area 62 that is masked by the removable spacer for actual etching of the contact area 62. Although formation of the contact area 62 is described in terms of etching materials throughout this description, it is understood that any suitable method of removing materials which is known in the art can be employed in lieu of etching. The edges of two adjacent word lines 68 (in phantom since they are buried) are separated from each other at substantially the lithographic minimum 69 and communicate with buried contact area 62.

FIG. 2B is a section view taken along lines 2B—2B of FIG. 2A. Phantom lines represent the removable spacer layer 66 that has been removed but that was previously deposited in order to etch sublithographic contact area 62. A dimension 70 is sublithographic and represents the size of the buried contact area 62.

FIG. 2C is a section view taken along lines 2C—2C of FIG. 2A. A dimension 72 is also sublithographic and represents the size of the contact area 62 as viewed from this cross-section. This sublithographic dimension improves subthreshold voltage characteristics since a buried contact edge 74 is a greater distance from an access transistor 76.

Figure 3A:
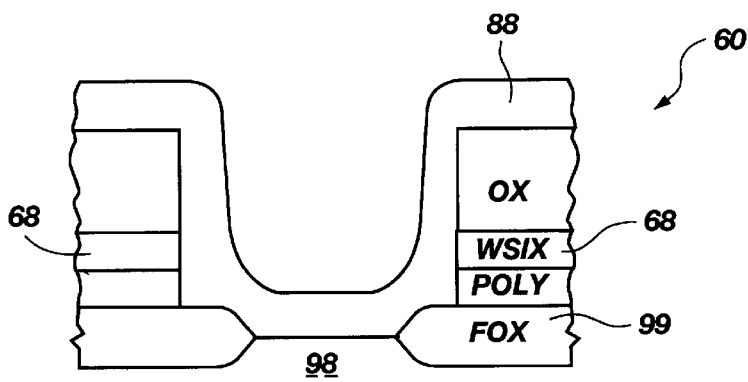
FIGS. 3A–D are section views of the steps involved in the present invention process for forming a removable spacer and a sublithographic buried contact as shown in FIG. 2B.

FIGS. 3A–D are section views of the steps involved in the present invention process for achieving a sublithographic buried contact as shown in FIG. 2B. FIG. 3A depicts how a plurality of transistor gate structures 68 has been formed on a substrate 98 and field oxide layer 99, and how insulator layer 88 (tetraethyl orthosilicate oxide) is deposited over and adjacent the gate structures and substrate.

Figure 3B:
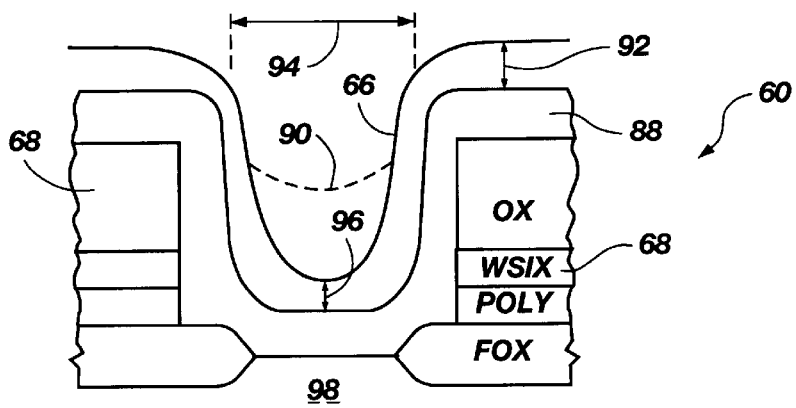
Figure 4A:
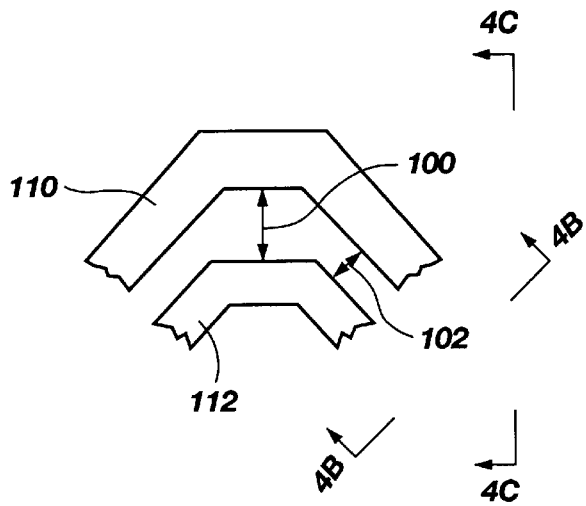
FIG. 4A is a plan view of a memory cell showing divergent and minimum word line widths for deposition of the removable spacer of the present invention.

FIG. 3B depicts how the removable spacer layer 66 is subsequently deposited over the insulator layer 88. In a preferred embodiment, the spacer layer 66 is an oxide, such as ozone tetraethyl orthosilicate ($O_3$TEOS), deposited by a conventional tetraethyl orthosilicate (TEOS) process. The use of $O_3$TEOS provides improved etching selectivity; that is, it has a ratio of etch rate perpendicular to the surface of the underlying insulator layer 88 of at least 10 to 1. It is understood that the etching selectivity ratio of the spacer layer 66 can alter depending on the material composition of the underlying insulator layer 88 and removal (etching) technique used. In light of the aforementioned variables, it is further understood that the spacer layer 66 of the present invention can be formed of any suitable spacer layer material, such as polysilicon or silicon nitride, that etches faster than the underlying insulator layer 88. The spacer layer 66 is deposited at a thickness 92 of substantially ½ the distance between the two adjacent word lines (gate structures 68) as measured at a minimum width point (102 as shown in FIG. 4A) defined elsewhere along the word lines. In this diagram, the gate structures 68 are separated by a divergent gap distance 94 that is greater than the minimum distance elsewhere separating the word lines. The distance 94 is greater because, at a cell location, the width between word lines increases to accommodate the cell.

When the spacer layer 66 is deposited at a thickness of substantially ½ the distance measured at the minimum width point, any gap that is existing at that minimum width point is substantially filled in or bridged by the spacer layer. However, since the gap 94 is greater than the minimum gap, the gap 94 is not substantially filled in by the spacer layer 66. Rather, the spacer layer 66 has a thickness 96 at the bottom of the cell, which is less than the thickness that exists at the minimum width point (not shown) that has been filled in by the spacer layer. A phantom line 90 depicts how the gap 94 would be filled in too much if the spacer layer was deposited too thick.

Figure 4B:
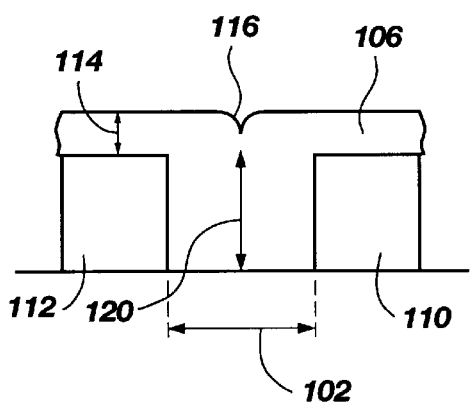
FIG. 4B is a section view taken along lines 4B—4B of FIG. 4A.
Figure 4C:
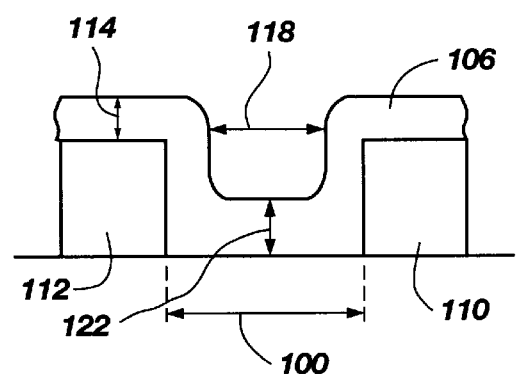
FIG. 4C is a section view taken along lines 4C—4C of FIG. 4A.

FIGS. 4A–C more clearly illustrate the distinction between the deposition of the spacer layer where word lines diverge at a cell location and the deposition at a minimum width area of the word lines is more clearly defined. Specifically, FIG. 4A represents two adjacent word lines 110 and 112 having a divergent width 100 at a location where the word lines communicate with a DRAM cell and buried contact location. FIG. 4A also depicts a minimum width 102 elsewhere between the word lines 110 and 112.

FIG. 4B shows how a thickness 114 of the spacer layer 106 is deposited at substantially ½ the thickness of a minimum width 102, thereby causing a gap 116 to be essentially filled in with the spacer. In contrast, FIG. 4C shows how the spacer layer 106, although deposited at substantially the same thickness 114, does not completely fill in a second gap 118 because a divergent width 100 is larger than the minimum width 102 (FIG. 4A).

Accordingly, when etching occurs, a contact is etched through the spacer layer 106 in the divergent width 100 of FIG. 4C, but a contact is not etched through the minimum width 102 (FIG. 4B) because the spacer 106 has a thickness 120 associated with the minimum width 102 that is greater than the thickness 122 associated with the divergent width 100.

Referring back to FIGS. 3A–D, after the spacer layer 66 and the insulator layer 88 have been anisotropically etched, the buried contact area 62 of FIG. 3C is depicted as having a sublithographic measurement 70. Elsewhere along the word gate structures 68, at the previously-described minimum width 102, any etching that has occurred will not have penetrated completely through the spacer layer 66 at that point because the gap is filled by the spacer layer 66 more fully than at the buried contact area 62 (see FIGS. 4A–C). Consequently, etching connects through to the substrate 98 at the buried contact area 62, but does not connect through elsewhere at the minimum width 102 along the gate structures 68.

Figure 3C:
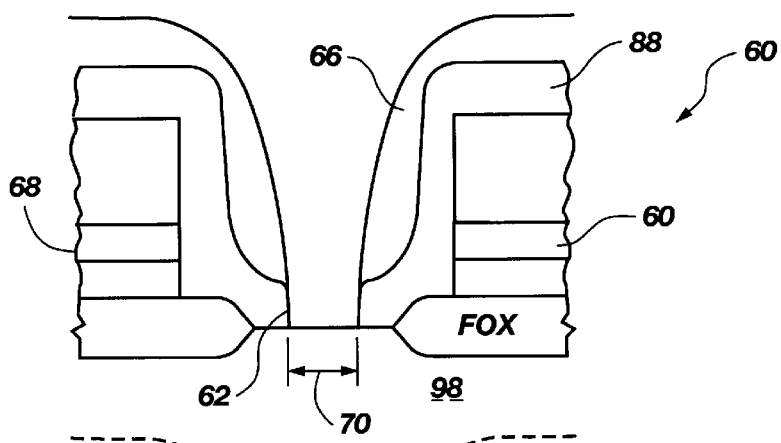
Figure 3D:
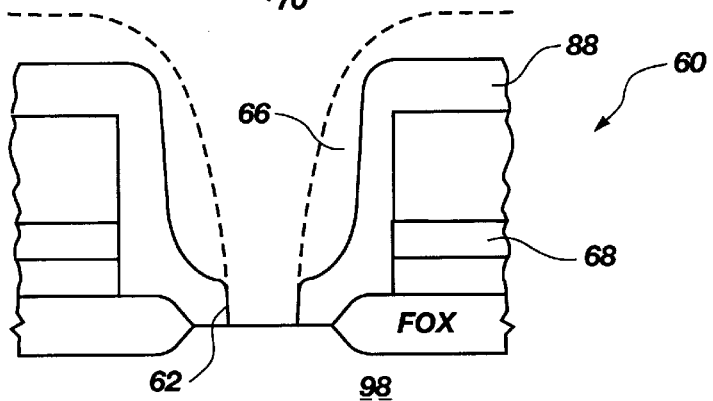

FIG. 3D depicts how the spacer layer 66 is completely removed after being isotropically etched and how the sublithographic buried contact area 62 communicates with the substrate 98 through the insulator layer 88. Complete isotropic etching of the spacer layer 66 is performed by any conventional method, such as by dipping the DRAM in hydrofluoric acid. Additionally, where the spacer layer 66 is $O_3$TEOS, complete isotropic etching is facilitated and more exact due to the etching selectivity of $O_3$TEOS, as previously discussed. The spacer layer 66 is shown in phantom to depict its previous existence, and accordingly, FIG. 3D is representative of FIG. 2B.

Figure 5:
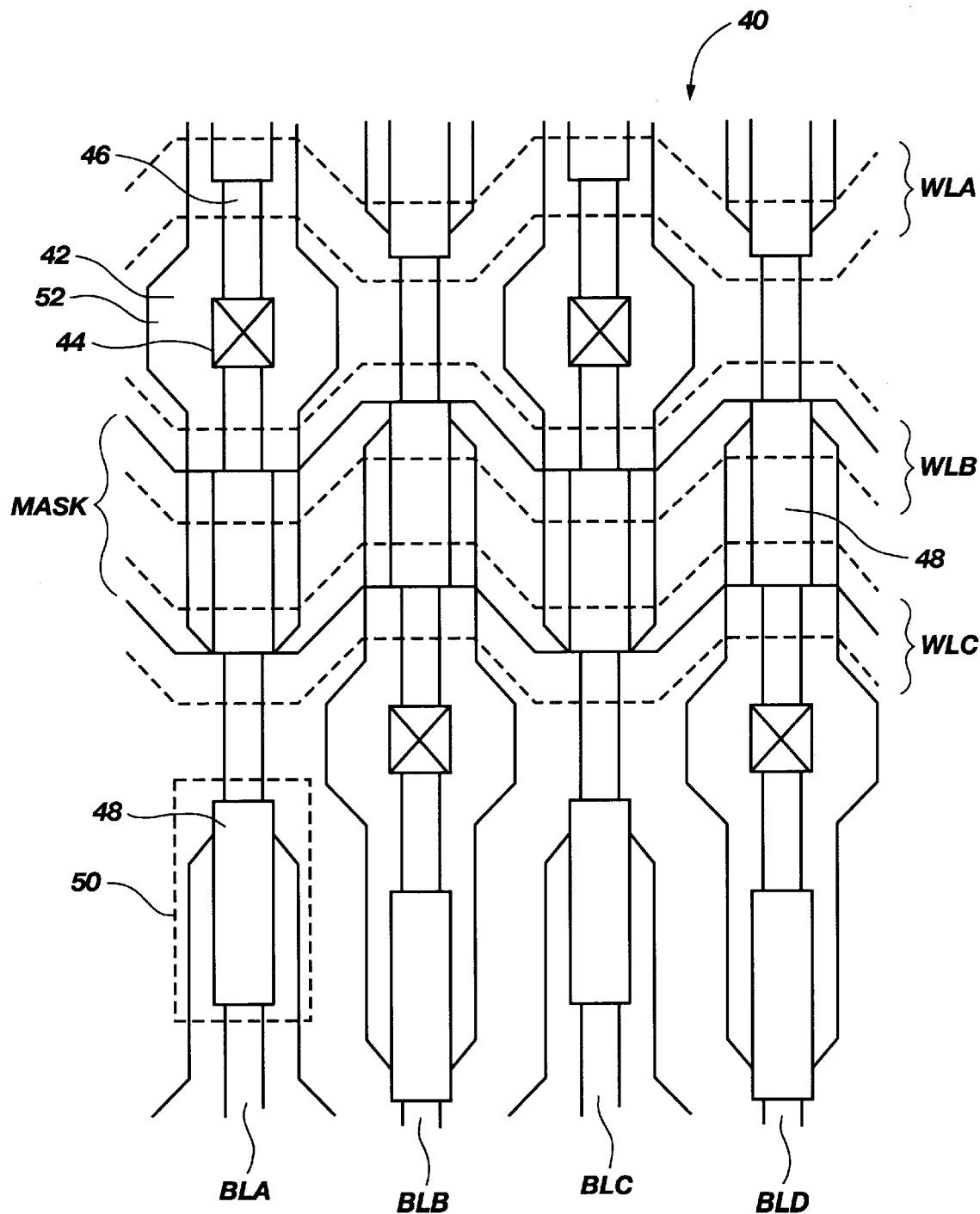
FIG. 5 is a plan view of a multicell DRAM layout depicting masking options for use in the present invention process.

FIG. 5 is a plan view of a layout of multiple DRAM and capacitor cells 40 incorporating the present invention wherein masking options are identified. For clarity, not all the elements of each cell are included in each cell. In this figure, there are four vertically running bitlines (BLA, BLB, BLC, and BLD) and three (phantom) word lines (WLA, WLB, and WLC) that zigzag horizontally across the figure. Bitlines connect to active areas (source or drain) 42 at each of the contacts 44 (represented as squares). The word lines WLA, WLB, and WLC connect to the gate areas 46. A cell buried contact 48 (represented as a rectangle) is located above and below each of the contacts (bitline squares) 44. Although the buried contact and storage plate 48 appear rectangular in this drawing, they would typically be more of an oval shape. The larger rectangles (in dotted lines) represent storage plates 50 which completely cover the buried contact. The top plate layer (not shown) covers the entire surface except for octagonal opening 52 around each of the bitline contacts 44.

FIG. 5 demonstrates how a single, continuous mask opening is implemented according to the present invention to create the plurality of buried contacts. A single opening in a mask runs parallel to each depicted word line WLA-C in order to etch the buried contacts. A single, continuous opening in a mask is usable because the present invention spacer layer is thicker at the minimum width points between adjacent parallel word lines than at the locations where the buried contacts are formed. The difference in spacer layer thickness allows for the use of the single opening in the mask and allows for complete etching at the buried contact locations, but only partial etching elsewhere along the word lines.

Alternately, a traditional mask could be used wherein each and every buried contact location is singularly and separately defined in the mask.

Figure 6:
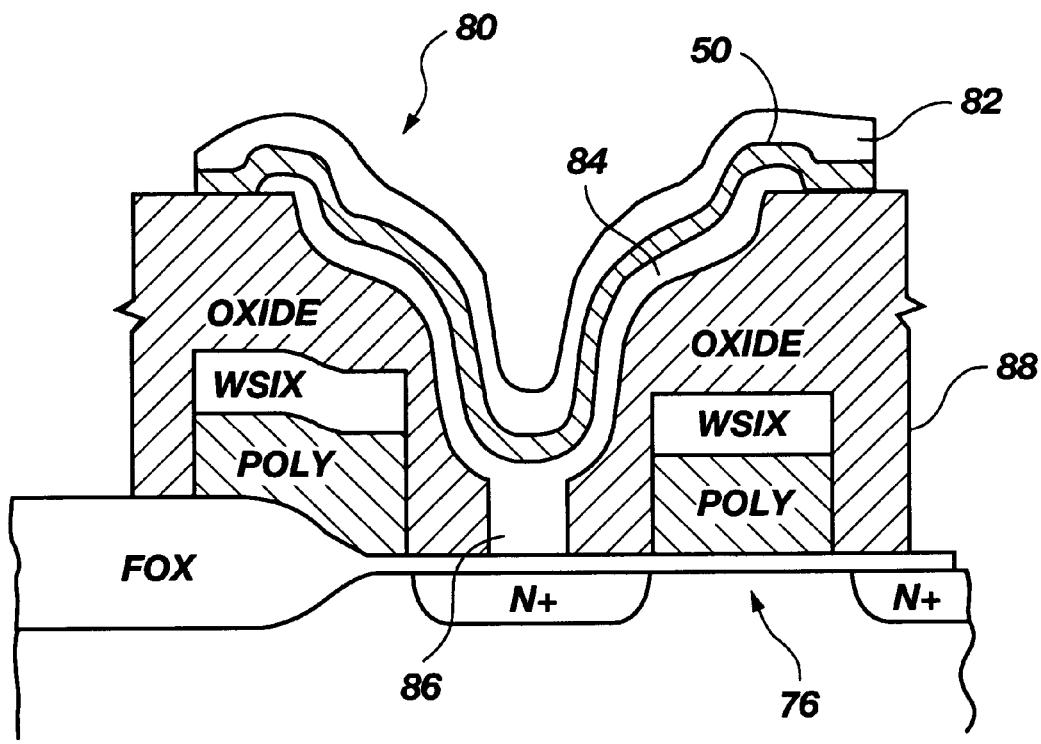
FIG. 6 is a cross-section of the present invention after forming a capacitor over the buried contact.
Figure 2C:
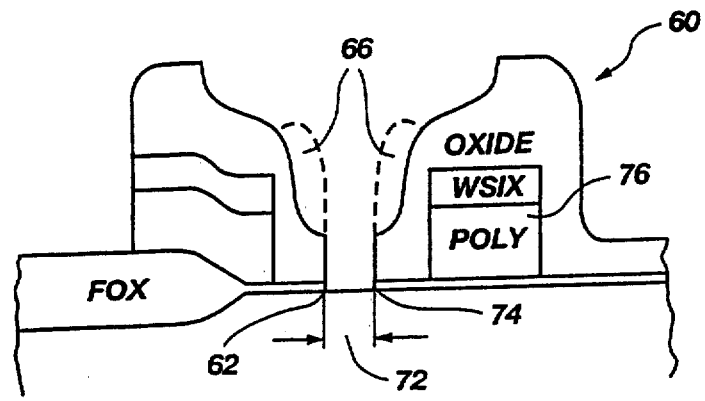
Figure 2B:
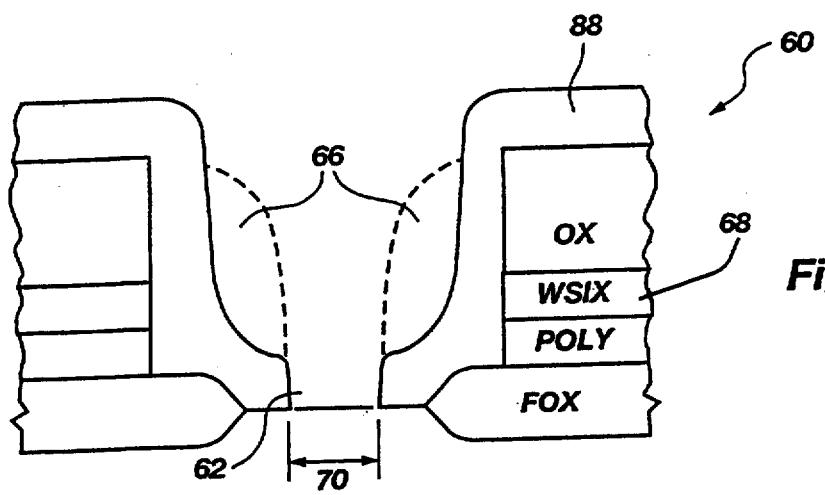
Figure 2A:
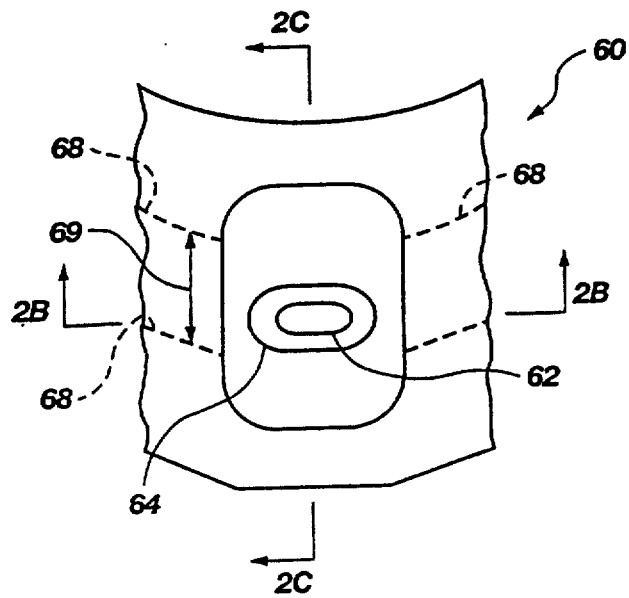
Figure 3A:
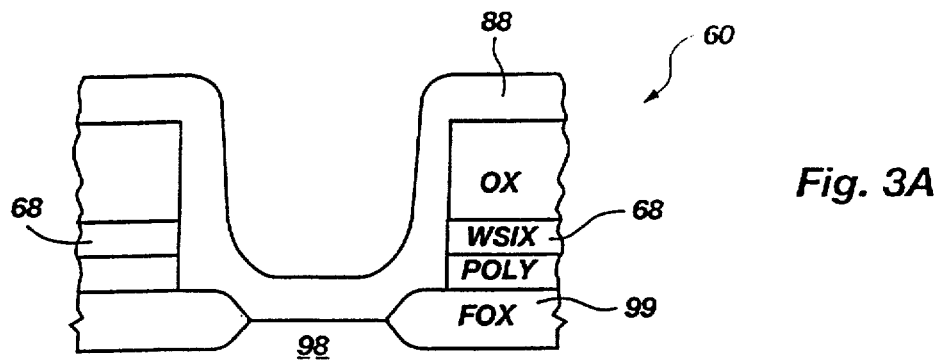
Figure 3B:
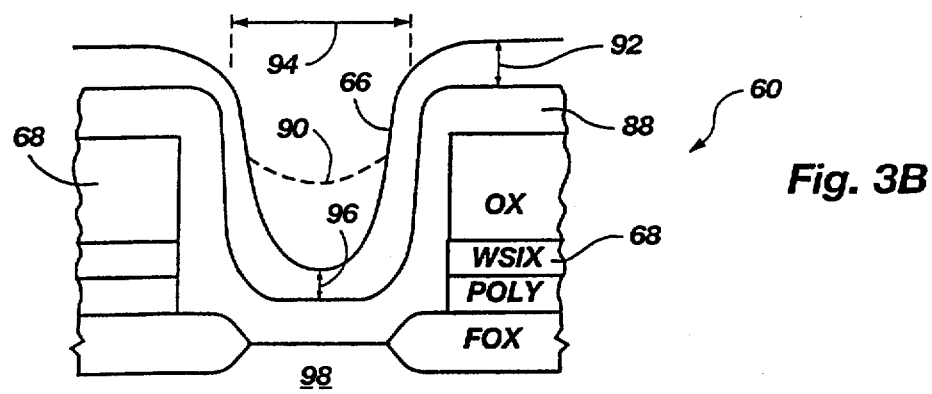
Figure 3C:
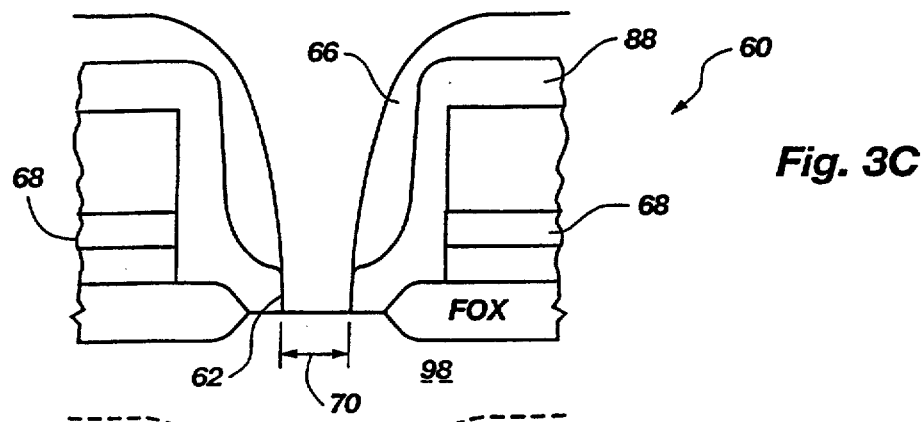
Figure 3D:
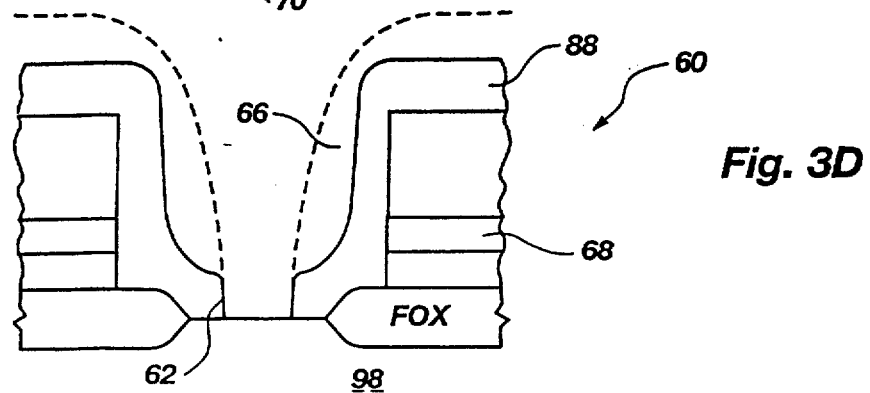
Figure 6:
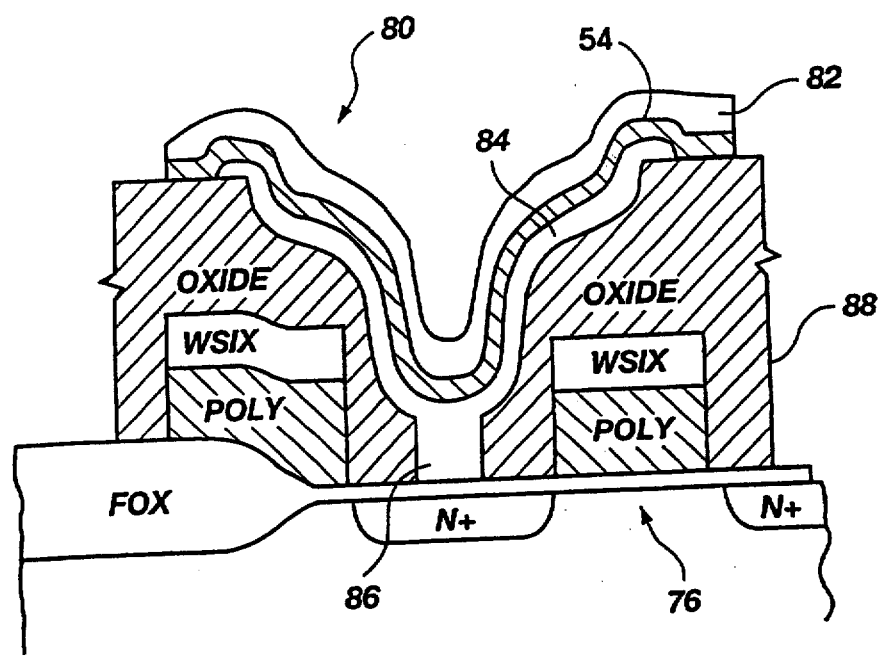

FIG. 6 illustrates the transistor 76 and a capacitor 80 after deposition and patterning of the dielectric layer 50 and top plate 82 over the storage plate 84 and the buried contact 86. A typical material for use as the dielectric layer 50 is a silicon nitride. The top plate 82 is typically a third layer of polysilicon. The buried contact 86 is sublithographic according to principles of the present invention and provides the advantages over the prior art as previously described herein.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of forming a sublithographic buried contact on a semiconductor device comprising:

forming a plurality of transistor gate structures and word lines adjacent a buried contact area on a substrate, the word lines lying in substantially parallel relation to one another and defining a first gap between word lines peripheral to the buried contact and a second gap between word lines over the buried contact, which second gap is wider than the first gap;

depositing an insulator layer over and adjacent the gate structures, word lines, buried contact area, and substrate;

depositing a removable spacer layer over the insulator layer to substantially fill the first gap, to partially fill the second gap, and to define a sublithographic dimension between removable spacer walls over the buried contact area, the removable spacer walls being formed by the removable spacer layer adjacent the plurality of gate structures, wherein the removable spacer layer provides an enhanced etching selectivity in relation to an underlying layer material;

anisotropically removing selected portions of the removable spacer layer and the insulator layer to form the buried contact sublithographically in at least a dimension parallel to the word lines; and further removing a remainder of the removable spacer layer.

2. The method as recited in claim 1 wherein the insulator layer comprises an oxide deposited by a tetraethyl orthosilicate (TEOS) process.

3. The method as recited in claim 1 wherein the removable spacer layer comprises ozone tetrtethyl orthosilicate ($O_3$TEOS), and wherein said $O_3$TEOS provides an etching selectivity ratio of at least 10 to 1 in relation to an underlying layer material.

4. The method as recited in claim 1 wherein the removable spacer layer is deposited at a thickness of substantially one-half a width of the first gap.

5. The method as recited in claim 1 wherein the removable spacer layer is of a lesser thickness over the buried contact area than over the first gap.

6. The method as recited in claim 1 further including patterning a plurality of buried contact areas defined by a plurality of discrete openings in a mask pattern.

7. The method as recited in claim 1 further including patterning a plurality of buried contact areas defined by a continuous opening in a mask pattern.

8. The method as recited in claim 1 wherein said anisotropic removal to form the buried contact comprises an anisotropic etch.

9. The method as recited in claim 1 wherein said anisotropic removal is continuous, parallel to word lines communicating with the buried contact area and forms the buried contact only at the buried contact area.

10. The method as recited in claim 1 wherein further removing the remainder of the removable spacer layer comprises etching.

11. The method as recited in claim 10 wherein the etch comprises dipping the semiconductor device in hydrofluoric acid.

12. A method of forming a connection to a semiconductor wafer having transistor gate structures thereon, the transistor gate structures lying in substantially parallel orientation with respect to one another and being formed to define a first gap and a second gap between the gate structures, which second gap overlies a location defined for the connection and is wider than the first gap, the method comprising:

depositing an insulator over the wafer and gate structures;

depositing a removable spacer over the insulator to substantially fill the first gap and to partially fill the second gap with the removable spacer, a thickness of the removable spacer in the first gap being greater than a thickness of the removable spacer in the second gap, wherein the removable spacer provides an enhanced etching selectivity in relation to an underlying layer material;

anisotropically removing portions of the removable spacer and insulator to form the connection sublithographically in at least a dimension parallel to the gate structures; and completely removing, a remainder of the removable spacer.

13. The method as recited in claim 12 wherein the removable spacer is of a substantially lesser thickness over the connection than over other areas of the insulator.

14. The method as recited in claim 12 wherein the anisotropic removal to form the connection comprises an anisotropic etch.

15. The method as recited in claim 12 wherein the complete removal of the remainder of the removable spacer comprises an isotropic etch.

16. The method as recited in claim 12 wherein the removable spacer comprises ozone tetraethyl orthosilicate ($O_3$TEOS) and wherein said $O_3$TEOS provides an etching selectivity ratio of at least 10 to 1 in relation to the underlying layer material.

17. The method as recited in claim 12 wherein the removable spacer is deposited at a thickness of substantially one-half of a width of the first gap.

18. The method as recited in claim 12 further including patterning a plurality of connections defined by a plurality of discrete openings in a mask pattern.

19. The method as recited in claim 12 further including patterning a plurality of connections defined by a continuous opening in a mask pattern.

20. The method as recited in claim 12 wherein said anisotropic removal is continuous and parallel to the first and second gaps and wherein the connection forms only at the second gap.

21. A method of forming a buried contact to a semiconductor DRAM substrate comprising:

forming a plurality of transistor gate structures and word lines, the word lines having a first gap between word lines peripheral to the buried contact and a second gap between word lines over the buried contact, which second gap is wider than the first gap;

depositing an insulating oxide by a tetraethyl orthosilicate process over and adjacent to the plurality of gate structures and word lines;

depositing a removable ozone tetraethyl orthosilicate ($O_3$TEOS) spacer layer over said insulating oxide to substantially fill the first gap and to partially fill the second gap with the removable spacer layer, wherein said $O_3$TEOS spacer layer provides an etching selectivity ratio of at least 10 to 1 in relation to said insulating oxide;

patterning a buried contact area in the removable spacer layer with a continuous pattern in a direction parallel to word lines adjacent the buried contact area;

anisotropically removing the removable spacer layer and the insulating oxide to form the buried contact sub-lithographically in at least a dimension parallel to the word lines; and isotropically removing remaining portions of the removable spacer layer.

\* \* \* \* \*

UNITED STATES PATENT AND TRADEMARK OFFICE
CERTIFICATE OF CORRECTION

PATENT NO : 6,010,953
DATED : January 4, 2000
INVENTOR(S) : Prall

Page 1 of 5

It is certified that error appears in the above-identified patent and that said Letters Patent are hereby corrected as shown below:

In the Drawings

In Fig. 2B, reference numeral "68" should be pointing to "WSIX" box instead of "OX" box;

In Fig. 3C, change reference numeral "60" on right hand side to --68--; and

In Fig. 6, change reference numeral "50" to --54--.

In the Specification

| | | |
|---|---|---|
| Column 3, | line 27, | change "word lines" to --transistor gate structures--; |
| Column 4, | line 41, | after "spacer" insert --layer--; |
| Column 4, | line 49, | delete "word"; and |
| Column 5, | line 40, | change "dielectric layer 50" to --dielectric layer 54--. |

UNITED STATES PATENT AND TRADEMARK OFFICE
CERTIFICATE OF CORRECTION

PATENT NO : 6,010,953
DATED : January 4, 2000
INVENTOR(S) : Prall

It is certified that error appears in the above-identified patent and that said Letters Patent are hereby corrected as shown below:

| | | | |
|---|---|---|---|
| Claim 1, | Column 5, | line 63, | after "the" insert --plurality of--; |
| Claim 3, | Column 6, | line 18, | change "tetrtethyl" to --tetraethyl--; |
| Claim 3, | Column 6, | line 20, | change "an" to --the--; and |
| Claim 12, | Column 7, | line 1, | after "removing" delete "," and change "ot" to --of--. |

Signed and Sealed this

Fifteenth Day of May, 2001

Attest:

NICHOLAS P. GODICI

Attesting Officer

Acting Director of the United States Patent and Trademark Office